United States Patent
Takeda et al.

(10) Patent No.: US 9,659,789 B2
(45) Date of Patent: May 23, 2017

(54) ETCHING METHOD AND ETCHING APPARATUS

(71) Applicant: Tokyo Electron Limited, Tokyo (JP)

(72) Inventors: Ryohei Takeda, Miyagi (JP); Ryuichi Takashima, Miyagi (JP); Yoshinobu Ooya, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/977,756

(22) Filed: Dec. 22, 2015

(65) Prior Publication Data

US 2016/0189975 A1 Jun. 30, 2016

(30) Foreign Application Priority Data

Dec. 25, 2014 (JP) .................................. 2014-262859

(51) Int. Cl.
| | |
|---|---|
| H01L 21/311 | (2006.01) |
| H01L 21/67 | (2006.01) |
| H01L 21/683 | (2006.01) |
| H01L 21/02 | (2006.01) |
| H01L 21/30 | (2006.01) |
| H01J 37/32 | (2006.01) |

(52) U.S. Cl.
CPC .. *H01L 21/31116* (2013.01); *H01J 37/32091* (2013.01); *H01J 37/32165* (2013.01); *H01J 37/32724* (2013.01); *H01L 21/02164* (2013.01); *H01L 21/67109* (2013.01); *H01L 21/6831* (2013.01)

(58) Field of Classification Search
None
See application file for complete search history.

(56) References Cited

U.S. PATENT DOCUMENTS

| | | | | |
|---|---|---|---|---|
| 5,259,922 A | * | 11/1993 | Yamano | H01J 37/32082 204/192.32 |
| 5,328,558 A | * | 7/1994 | Kawamura | H01L 21/31116 148/DIG. 17 |
| 5,494,522 A | * | 2/1996 | Moriya | C23C 16/4401 118/719 |
| 6,280,584 B1 | * | 8/2001 | Kumar | H02N 13/00 118/666 |
| 8,228,658 B2 | * | 7/2012 | Purohit | H01L 21/6833 361/234 |

(Continued)

FOREIGN PATENT DOCUMENTS

JP H07-022393 1/1995

*Primary Examiner* — Allan Olsen
(74) *Attorney, Agent, or Firm* — IPUSA, PLLC

(57) ABSTRACT

An etching method is provided. In the etching method, a temperature of a chiller configured to cool a pedestal is controlled so as to become −20 degrees C. or lower. Plasma is generated from a hydrogen-containing gas and a fluoride-containing gas supplied from a gas supply source by supplying first high frequency power having a first frequency supplied to the pedestal from a first high frequency power source. A silicon oxide film deposited on a substrate placed on the pedestal is etched by the generated plasma. Second high frequency power having a second frequency lower than the first frequency of the first high frequency power is supplied to the pedestal from a second high frequency power source in a static eliminating process after the step of etching the silicon oxide film.

9 Claims, 10 Drawing Sheets

(56) References Cited

U.S. PATENT DOCUMENTS

| | | | | |
|---|---|---|---|---|
| 9,006,106 B2* | 4/2015 | Kao | ............... | H01L 21/31144 |
| | | | | 438/689 |
| 2007/0066064 A1* | 3/2007 | Kutney | ............ | H01L 21/31116 |
| | | | | 438/689 |
| 2008/0314731 A1* | 12/2008 | Walther | ............ | H01J 37/32935 |
| | | | | 204/164 |
| 2014/0024220 A1* | 1/2014 | Chang | ............... | H01L 21/3065 |
| | | | | 438/710 |
| 2014/0134847 A1* | 5/2014 | Seya | ............... | H01L 21/3105 |
| | | | | 438/723 |
| 2014/0335697 A1* | 11/2014 | Indrakanti | ......... | H01L 21/76811 |
| | | | | 438/714 |

* cited by examiner

ETCHING METHOD AND ETCHING APPARATUS

CROSS-REFERENCE TO RELATED APPLICATIONS

This patent application is based upon and claims the benefit of priority of Japanese Patent Application No. 2014-262859, filed on Dec. 25, 2014, the entire contents of which are incorporated herein by reference.

BACKGROUND OF THE INVENTION

1. Field of the Invention

The present invention relates to an etching method and an etching apparatus.

2. Description of the Related Art

As disclosed in Japanese Laid-Open Patent Application Publication No. 7-22393, a method of forming a hole with a high aspect ratio by etching a silicon oxide film is proposed. For example, Japanese Laid-Open Patent Application Publication No. 7-22393 discloses a dry etching method for forming an opening with a high aspect ratio and preventing the film from depositing on an inner wall of a chamber to reduce a period of time required for a cleaning process of an etching apparatus.

Moreover, as an example of the method of forming the hole with the high aspect ratio in the silicon oxide film by etching, a technique is proposed of forming the hole by etching the film while using $C_4F_8/C_4F_6/Ar/O_2$ containing gas and keeping a temperature of a wafer high so as to deposit a reaction product on the opening of the hole as little as possible.

However, in the etching to form a hole or a trench with a high aspect ratio, depth loading, which is a phenomenon in which the etching does not progress at the bottom of the hole or the trench, occurs as the etching progresses. The depth loading is likely to occur as the aspect ratio becomes high.

SUMMARY OF THE INVENTION

Accordingly, in response to the above discussed problems, embodiments of the present invention aim to provide an etching method and an etching apparatus that prevent depth loading and increase an etching rate when etching a silicon oxide film.

According to one embodiment of the present invention, there is provided an etching method. In the etching method, a temperature of a chiller configured to cool a pedestal is controlled so as to become −20 degrees C. or lower. Plasma is generated from a hydrogen-containing gas and a fluoride-containing gas supplied from a gas supply source by supplying first high frequency power having a first frequency supplied to the pedestal from a first high frequency power source. A silicon oxide film deposited on a substrate placed on the pedestal is etched by the generated plasma. Second high frequency power having a second frequency lower than the first frequency of the first high frequency power is supplied to the pedestal from a second high frequency power source in a static eliminating process after the step of etching the silicon oxide film.

According to another embodiment of the present invention, there is provided an etching apparatus including a chiller configured to control a temperature of a cooling medium so as to keep the temperature at −20 degrees C. or lower in order to cool a pedestal. An electrostatic chuck made of titanium is provided on the pedestal and configured to hold a substrate thereon. A gas supply source is provided to supply a hydrogen-containing gas and a fluoride-containing gas to the pedestal. A first high frequency power source is configured to supply first frequency power to the pedestal so as to generate plasma from the hydrogen-containing gas and the fluoride-containing gas and to cause a silicon oxide film deposited on the substrate to be etched by the plasma.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Figure 1:
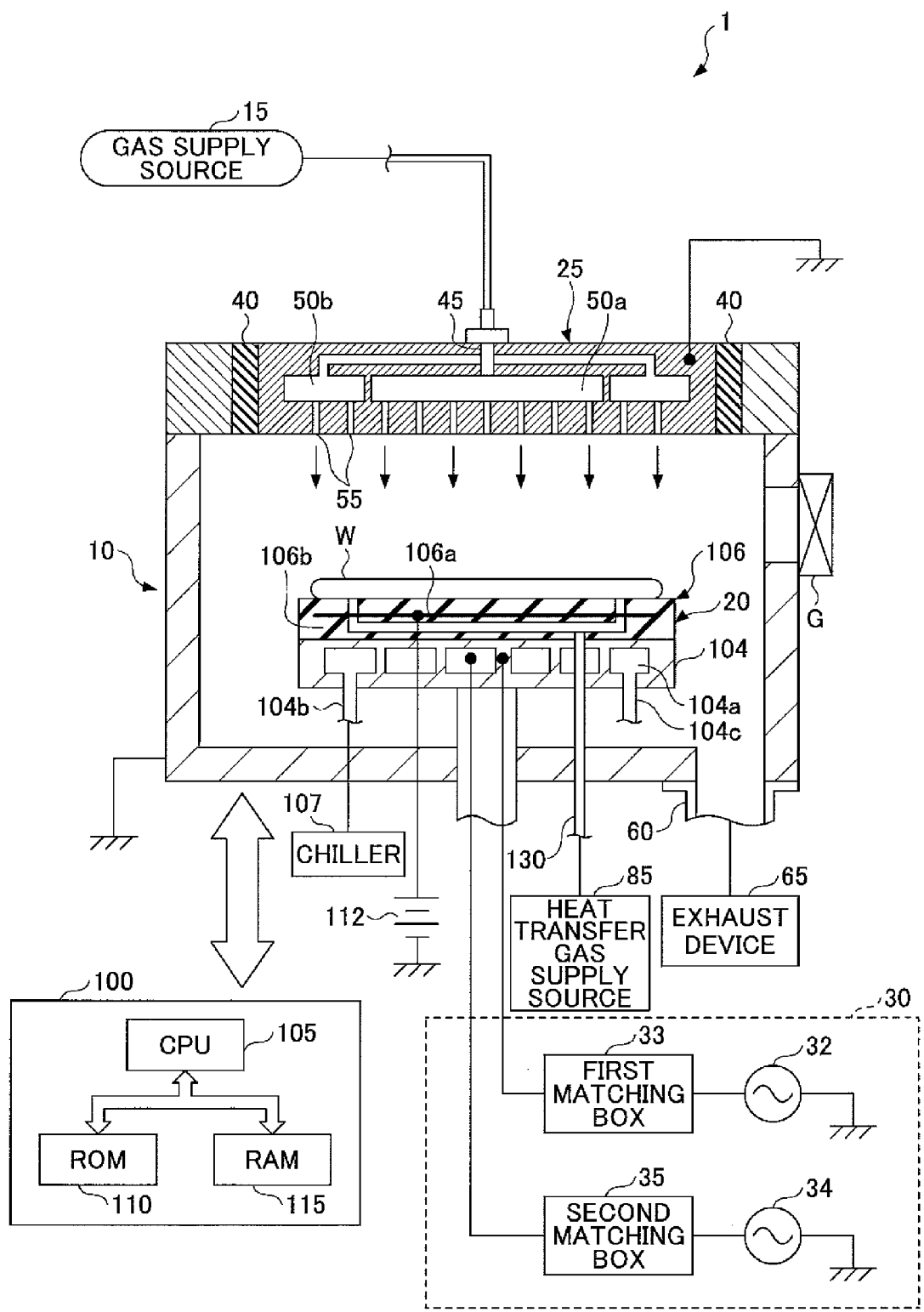
FIG. 1 is a vertical cross-sectional view of an etching apparatus according to an embodiment of the present invention.

A description is given below of embodiments of the present invention, with reference to accompanying drawings. Note that elements having substantially the same functions or features may be given the same reference numerals and overlapping descriptions thereof may be omitted.

[Overall Configuration of Etching Processing Apparatus]

To begin with, a description is given below of an etching apparatus 1 according to an embodiment of the present invention with reference to FIG. 1. FIG. 1 illustrates an example of a vertical cross section of the etching apparatus 1 according to the embodiment. The etching apparatus 1 of the embodiment is configured to be a parallel plate type plasma processing apparatus (capacitively-coupled plasma processing apparatus) including a pedestal 20 and a gas shower head 25 that are disposed to be parallel with each other in a chamber 10. The pedestal 20 also functions as a lower electrode, and the gas shower head 25 also functions as an upper electrode.

The etching apparatus 1 includes the chamber 10 with a surface, for example, made of alumited (anodized) aluminum. The reaction chamber 10 is connected to the ground. The pedestal 20 is installed on a bottom of the chamber and receives a semiconductor wafer (which is hereinafter just called a "wafer W") thereon. The wafer W is an example of a substrate that is an object subject to be etched, and includes a mask film on a silicon oxide film formed thereon.

The pedestal 20 is, for example, made of aluminum (Al), titanium (Ti), silicon carbide (SiC) and the like. An electrostatic chuck 106 for electrostatically attracting the wafer W thereon is provided on an upper surface of the pedestal 20. The electrostatic chuck 106 is configured to have a chuck electrode 106a sandwiched between insulating bodies 106b or surrounded by the insulating body 106b. A direct voltage source 112 is connected to the chuck electrode 106a, and attracts the wafer W on the electrostatic chuck 106 by Coulomb's force by applying a direct voltage HV to the chuck electrode 106a.

The pedestal 20 is supported by a support 104. A refrigerant passage 104a is formed inside the support 104. A refrigerant inlet pipe 104b and a refrigerant outlet pipe 104c are connected to the refrigerant passage 104. A cooling medium output from a chiller 107 such as cooling water and brine circulates through the refrigerant inlet pipe 104b, the refrigerant passage 104a and the refrigerant outlet pipe 104c. This causes the pedestal 20 and the electrostatic chuck 106 to be cooled.

A heat transfer gas supply source 85 supplies a heat transfer gas such as helium gas (He) or argon gas (Ar) to a back surface of the wafer W on the electrostatic chuck 106 through a gas supply line 130. Such a configuration allows a temperature of the electrostatic chuck 106 to be controlled by the cooling water flowing through the refrigerant passage 104a and the heat transfer gas supplied to the back surface of the wafer W. As a result, the wafer W can be controlled so as to become a predetermined temperature.

A power supply device 30 for supplying superimposed power of two frequencies is connected to the pedestal 20. The power supply device 30 includes a first high frequency power source 32 that supplies first high frequency power (high frequency power for generating plasma) of a first frequency and a second high frequency power source 34 for supplying second high frequency power (high frequency power for generating a bias voltage) of a second frequency. The first high frequency power source 32 is electrically connected to the pedestal 20 through a first matching box 33. The second high frequency power source 34 is electrically connected to the lower electrode 20 through a second matching box 35. For example, the first high frequency power source 32 supplies the first high frequency power of 40 MHz to the pedestal 20. For example, the second high frequency power source 34 supplies the second high frequency power of 0.3 MHz to the pedestal 20. Here, although the first high frequency power is supplied to the pedestal 20 in the embodiment, the first high frequency power may be supplied to the gas shower head 25.

The first matching box 33 causes load impedance of the first high frequency power source 32 to match internal (or output) impedance thereof. The second matching box 34 causes load impedance of the second high frequency power source 34 to match internal (or output) impedance thereof. The first matching box 33 functions to cause the load impedance of the first high frequency power source 32 to appear the same as the internal impedance thereof when plasma is generated in the chamber 10. The second matching box 35 functions to cause the load impedance of the second high frequency power source 34 to appear the same as the internal impedance thereof when plasma is generated in the chamber 10.

The gas shower head 25 is attached to the chamber 10 through a shield ring 40 covering a peripheral side wall thereof so as to close an opening of a ceiling part of the chamber 10. The gas shower head 25 may be electrically grounded as illustrated in FIG. 1. Moreover, by connecting a variable direct current power source to the shower head 25, a predetermined direct current (DC) voltage may be applied to the shower head 25.

A gas introduction port 45 for introducing a gas is formed in the gas shower head 25. A diffusion chamber 50a located on a central side and a diffusion chamber 50b located on an edge side for diffusing a gas diverged from the gas introduction port 45 and introduced thereto are provided inside the gas shower head 25. The gas supplied from a gas supply source 15 is supplied to the diffusion chambers 50a and 50b through the gas introduction port 45, and diffuses across each of the diffusion chambers 50a and 50b. Then, the gas is introduced toward the pedestal 20 from many gas supply holes 55.

An exhaust opening 60 is formed in a bottom surface of the chamber 10, and the chamber 10 is evacuated by an exhaust device 65 connected to the exhaust opening 60. This enables the inside of the chamber 10 to be maintained at a predetermined degree of vacuum. A gate valve G is provided at a side wall 102 of the chamber 10. The gate valve G opens and closes a carry-in/out opening when carrying the wafer in/out of the chamber 10.

The etching apparatus 1 includes a control unit 100 configured to control the operation of the entire apparatus. The control unit 100 includes a CPU (Central Processing Unit) 105, a ROM (Read Only Memory) 110 and a RAM (Random Access Memory) 115. The CPU 105 performs a desired process such as the etching process and the static eliminating process described later in accordance with a recipe stored in these memory areas. The recipe specifies control information of the apparatus corresponding to process conditions such as process time, a pressure (evacuation of the gas), high frequency power and voltage, various gas flow rates, temperatures inside the chamber 10 (an upper electrode temperature, a side wall temperature of the chamber 10, a temperature of the electrostatic chuck 106 and the like), and a temperature of the chiller 107. Here, the recipe specifying programs and process conditions thereof may be stored in a hard disk or a semiconductor memory. Furthermore, the recipe may be set in a predetermined position of the memory area in a state of being stored in a portable computer readable storage medium such as a CD-ROM, a DVD and the like.

When performing an etching process, open and close of the gate valve G is controlled, and a wafer W is carried in the chamber 10 and placed on the pedestal 20. The direct current voltage source 12 applies a direct current voltage HV to the chuck electrode 106a, thereby attracting and holding the wafer W on the electrostatic chuck 106a by Coulomb's force.

Next, a gas for etching and high frequency power are supplied to the chamber 10, thereby generating plasma. A plasma etching process is performed on the wafer by the generated plasma.

After the etching process, the direct current voltage source 112 applies a DC voltage HV having an opposite sign to the DC voltage applied to the chuck electrode 106a while attracting the wafer W to the chuck electrode 106a in order to eliminate the charge of the wafer W, thereby removing the wafer W from the electrostatic chuck 106. The open and close of the gate valve G is controlled, and the wafer W is carried out of the chamber 10.

[Etching Process]

Next, a description is given below of an etching process on a silicon oxide film ($SiO_2$) performed by the etching apparatus 1 having such a configuration according to the embodiment. When forming a hole or a trench having a high aspect ratio into the silicon oxide film, there is provided an etching method of forming the hole by using, for example, $C_4F_8/C_4F_6/Ar/O_2$ containing gas, and by setting a temperature of the wafer W at a high temperature so as to deposit a reaction product on an opening of the hole as little as possible.

However, in the hole and the trench having the high aspect ratio, a depth loading occurs as the etching progresses. Moreover, the depth loading is likely to occur as the aspect ratio increases. Because of this, according to the above etching method, the etching may not progress when forming a hole having a higher aspect ratio in the future.

Therefore, the etching apparatus 1 according to the embodiment provides an etching method for preventing the depth loading and improving an etching rate when etching the silicon oxide film.

Experiment 1

In the etching process according to the embodiment, the silicon oxide film is etched in an extremely low temperature process having a control temperature of the chiller 107 of −20 degrees C. or lower while supplying a hydrogen-containing gas and a fluoride-containing gas into the chamber 10. In an experiment 1, $CF_4$ gas was used as an example of the fluoride-containing gas and $H_2$ gas was used as an example of the hydrogen-containing gas.

Figure 2:
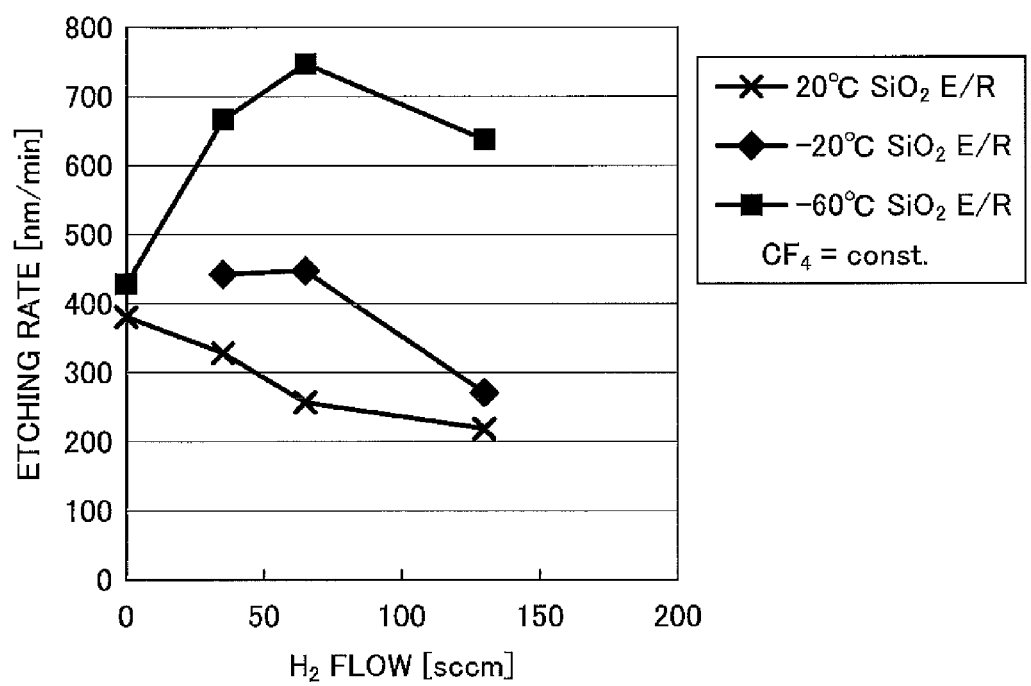
FIG. 2 is a graph showing an example of a relationship between an amount of hydrogen gas and an etching rate at an extremely low temperature according to an embodiment of the present invention.

FIG. 2 shows a result of the experiment 1 of the etching process according to the embodiment. FIG. 2 shows an extremely low temperature process setting a temperature of the cooling medium supplied from the chiller 107 at −20 degrees C., an extremely low temperature process setting the temperature of the cooling medium supplied from the chiller 107 at −60 degrees C., and a room temperature process setting the temperature of the chiller 107 at 20 degrees C. In any case, $CF_4$ gas and $H_2$ gas were supplied into the chamber 10. In order to measure an etching rate of the silicon oxide film when increasing a partial pressure of $H_2$ gas relative to $CF_4$ gas, the experiment 1 showed an etching rate when increasing a flow rate of $H_2$ gas while keeping a flow rate of $CF_4$ gas constant.

According to a result of the experiment 1, in the extremely low temperature processes setting the temperature of the chiller 107 at −20 degrees C. and −60 degrees C., when the partial pressure of $H_2$ gas relative to $CF_4$ gas increased, the etching rate increased up to a predetermined partial pressure. On the other hand, in the room temperature process setting the temperature of the electrostatic chuck 106 at 20 degrees C., the etching rate decreased as the partial pressure of $H_2$ gas relative to $CF_4$ gas increased.

Hence, in the etching process of the embodiment, the etching is performed by using $H_2$ gas and $CF_4$ gas, setting an appropriate partial pressure of $H_2$ gas relative to $CF_4$ gas, and setting the temperature of the chiller 107 at the extremely low temperature of −20 degrees C. or lower. This enables the etching rate to be increased. In particular, an inflection point indicating the etching rate became higher at and around −60 degrees C., and the etching rate is estimated to further become higher around a temperature lower than −60 degrees C.

Here, in the extremely low temperature process, the etching rate increased halfway and decreased therefrom when the partial pressure of $H_2$ gas increased. This is thought to be because an amount of F of $CF_4$ gas relative to $H_2$ gas decreases, which causes the etching to be unlikely to progress and reduces the etching rate.

(Analysis of Phenomenon)

Figure 3:
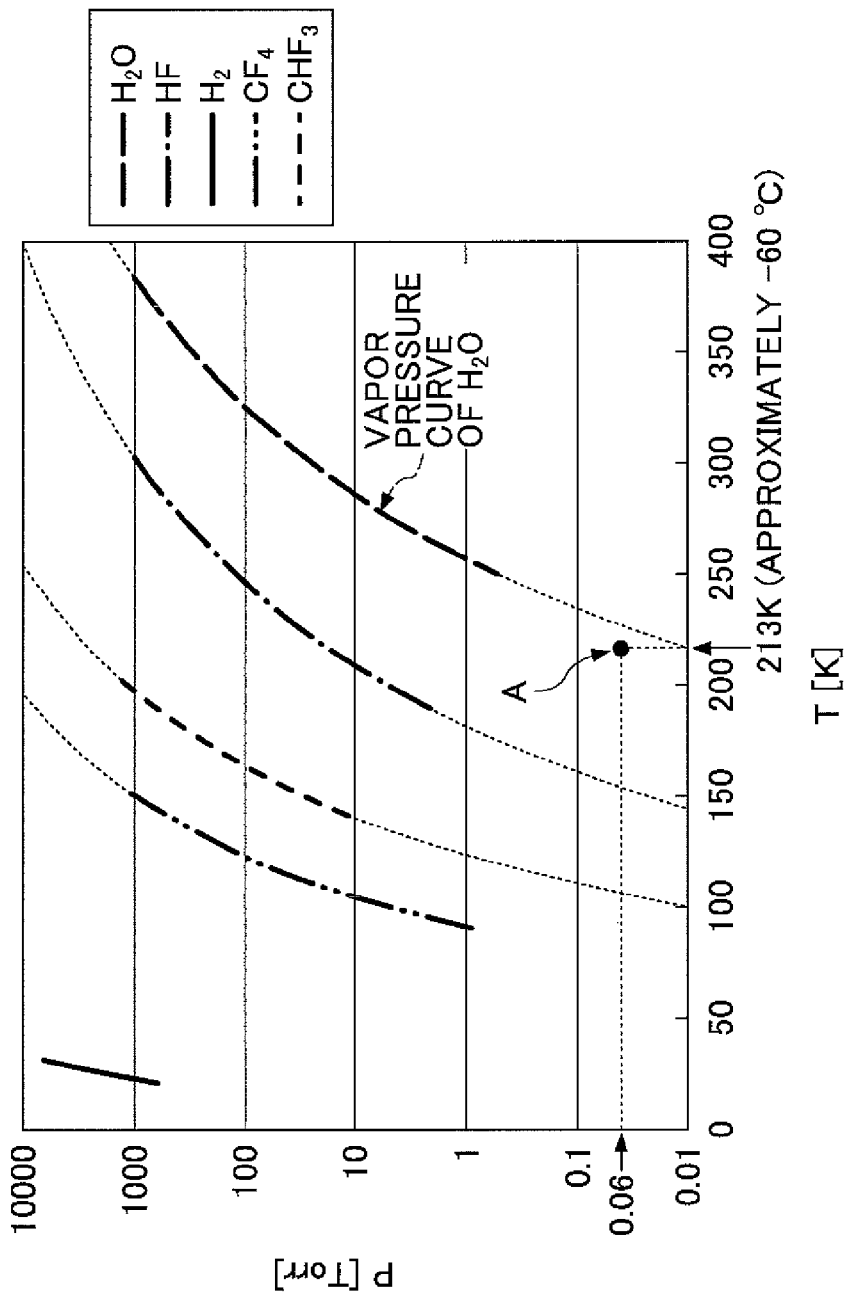
FIG. 3 is a graph showing a vapor pressure curve.

In the etching process of the embodiment, $H_2$ gas is supplied as an example of the hydrogen-containing gas, and $CF_4$ is supplied as an example of the fluoride-containing gas. As a result of the etching of the silicon oxide film by $H_2$ gas, $H_2O$ is generated as a reaction product. As shown by a vapor pressure curve, $H_2O$ has a low saturated vapor pressure. A solid line in FIG. 3 indicates an experimental value, and a broken line indicates a calculated value. A state on the vapor pressure curve is a mixed state of a liquid and a gas.

When the temperature of the chiller 107 is set at a low temperature of −20 degrees C., or preferably at an extremely low temperature of −60 degrees C. while keeping the pressure at 8.0 Pa (60 m Torr) during the etching, $H_2O$ on a surface of the silicon oxide film is saturated and present in a state of a liquid.

The liquid present on the surface of the silicon oxide film also contains HF-based radicals generated from $CF_4$ gas by reaction in addition to water of the reaction product. Because of this, hydrofluoric acid (HF) is generated by reaction of the HF-based radicals and water. Hydrofluoric acid dissolved in water on the surface of the silicon oxide film mainly urges the etching by chemical reaction, and the etching rate specifically increases. In the etching process of the embodiment, plasma conditions other than the temperature of the electrostatic chuck 106 do not change. Hence, the etching rate is thought to improve mainly by chemical reaction due to an action of the liquid of hydrofluoric acid present on the surface of the silicon oxide film.

Experiment 2

Figure 4:
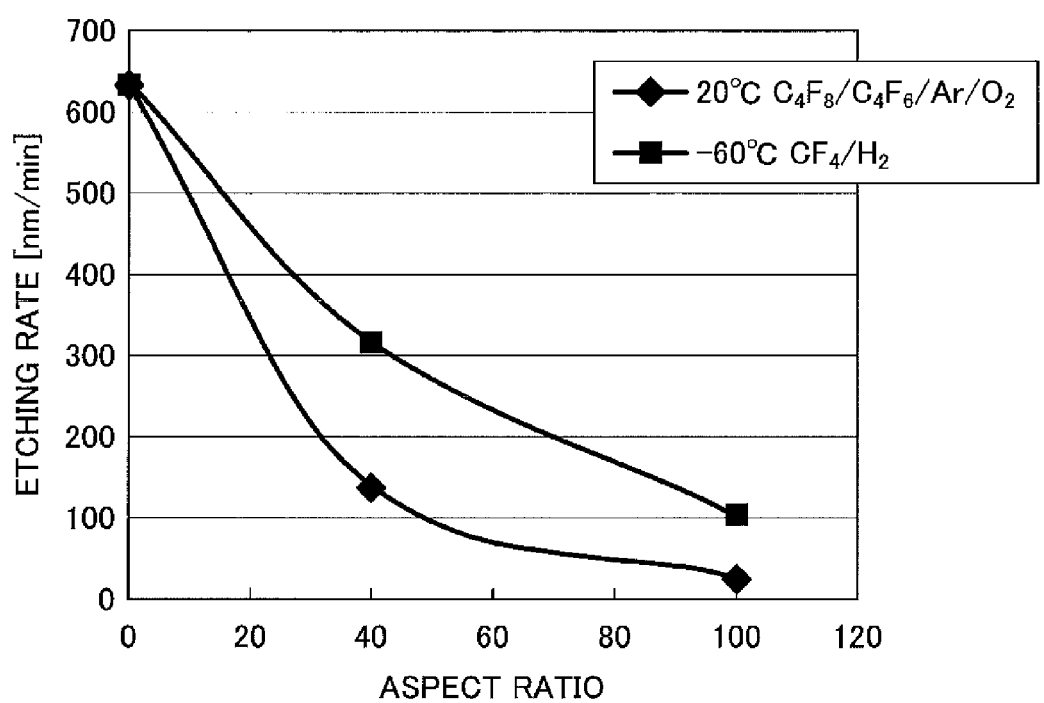
FIG. 4 is a graph showing an example of a relationship between an aspect ratio and an etching rate at an extremely low temperature.

FIG. 4 shows a relationship between an aspect ratio and an etching rate of a silicon oxide film as a result of an experiment 2 about the etching process of the embodiment. In the experiment 2, extremely low temperature process conditions in the etching process of the embodiment are as follows: a temperature of the chiller 107 was −60 degrees C., and gas types were $CF_4$ gas/$H_2$ gas. Room temperature process conditions of a comparative example were as follows: a temperature of the chiller 107 was 20 degrees C., and gas types were $C_4Fe/C_4F_6/Ar/O_2$.

The result indicates that the etching rate in the extremely low temperature process was two or more times higher than the etching rate in the room temperature process. This is because $CF_4$ gas used in the etching process of the embodiment is a low molecular weight gas and the radicals of $CF_4$ are more likely to reach the bottom of the hole than high molecular weight gases such as $C_4F_8$ gas and $C_4F_6$ used in the comparative example.

Furthermore, as discussed above, another reason for the above is that the reaction product is unlikely to deposit on the opening of the hole by the chemical reaction on the surface of the silicon oxide film in the etching process of the embodiment, and the etching progresses in a state unlikely to close the opening of the hole. For these reasons, in the etching process of the embodiment, the hole with a high aspect ratio can be formed.

Figure 5:
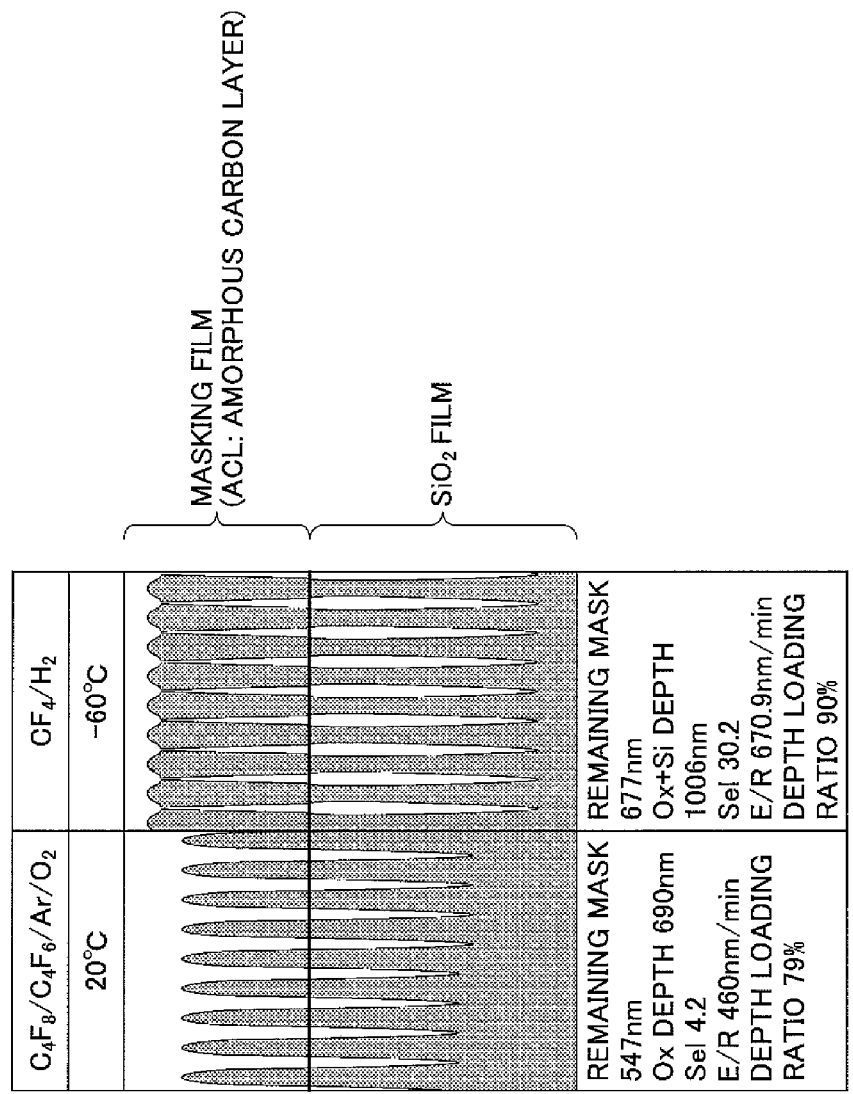
FIG. 5 is a diagram showing an example of a result of an etching process according to an embodiment of the present invention.

FIG. 5 shows an example of a vertical cross section of an etching shape of the hole formed as a result from the etching process of the experiment 2.

Here, the silicon oxide film was etched by using a masking film of an amorphous carbon layer (ACL). As a result of the etching, in the case of extremely low temperature process setting the temperature of the chiller 107 at −60 degrees C., the etching rate (E/R) became higher than the etching rate of the room temperature process, and mask selectivity (Sel) also became much better than the mask selectivity of the room temperature process. Thus, according to the etching method of the embodiment, the etching rate can be improved while suppressing the depth loading.

As described above, according to the etching method of the embodiment, by using $CF_4$ gas/$H_2$ gas as the gas species and by performing the extremely low temperature process setting the temperature of the chiller 107 at −20 degrees C. or lower (preferably −60 degrees C. or lower), the depth loading can be improved, and the etching rate and the mask selectivity can be increased.

The etching process of the embodiment can be applied to the etching of the silicon oxide film in manufacture of a three-dimensional stacked multilayer semiconductor memory such as 3D NAND flash memory. In this case, a hole and a trench with a high aspect ratio can be formed in the silicon oxide film and a stacked multilayer film containing the silicon oxide film by increasing the etching rate while suppressing the depth loading. In addition, the etching process of the embodiment can be applied to a multilayer stacked structure of an oxide film and a nitriding film and a multilayer stacked structure of the oxide film and a poly silicon film.

Here, an etching process by an extremely low temperature process using hydrofluorocarbon (HFC) may be performed by supplying $H_2$ gas as an example of the hydrogen-containing gas and supplying nitrogen trifluoride gas as an example of the fluoride-containing gas.

[Static Eliminating Process]

Figure 6:
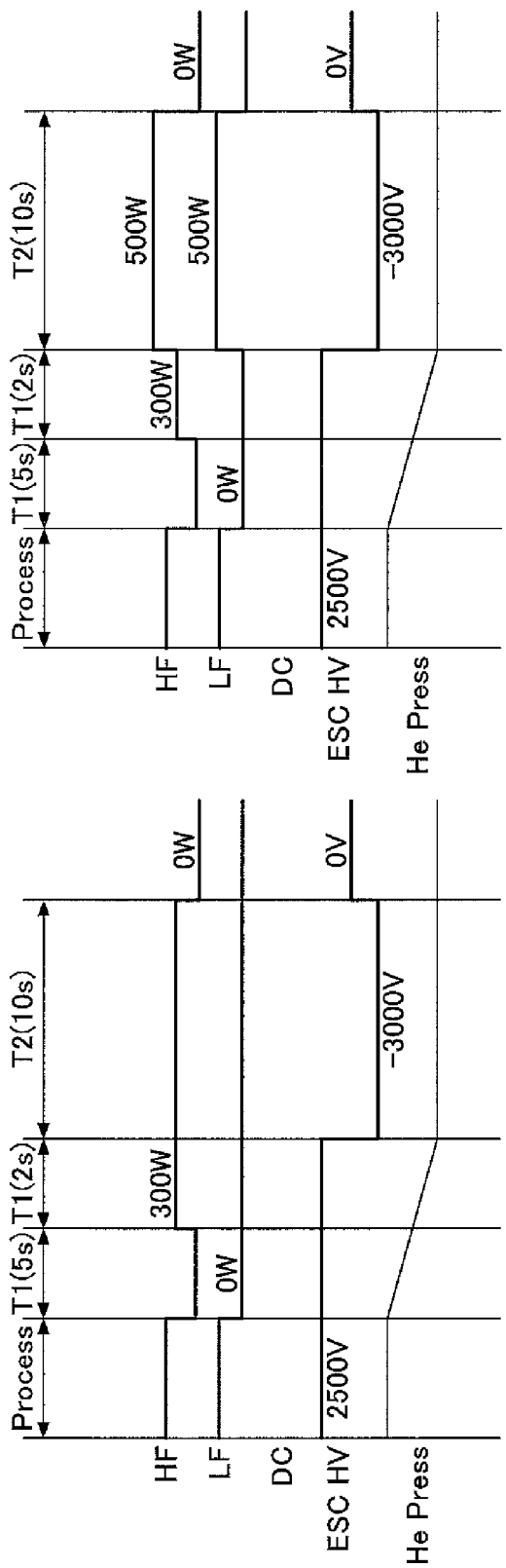
FIGS. 6A and 6B are graphs illustrating an example of an etching process and a static eliminating process according to an embodiment of the present invention.

Next, a description is given below of a static eliminating process performed when carrying a processed wafer W out of the chamber 10 after performing the etching process of the embodiment with reference to FIG. 6.

In the etching process of the embodiment, the silicon oxide film is etched by setting the temperature of the chiller 107 at an extremely low temperature in a range from −20 degrees C. to −60 degrees C. Due to this, the processed wafer W has a low temperature, and is carried out of the etching apparatus 1. Then, the processed wafer W is exposed to the atmosphere while being transferred to a FOUP (Front-Opening Unified Pod), during which condensation occurs on a surface of the wafer W.

As a method of preventing the condensation on the surface of the wafer W, carrying the wafer W out of the etching apparatus 1 after holding the wafer W in a load lock chamber (LLM, load lock module) for a few or several minutes, or transferring the wafer W to the FOUP after heating the wafer W by providing another heater, is considered.

However, when the wafer W is held for a few or several minutes, throughput of the entire process decreases. Also, when heating the wafer W by providing the heater, installing the heater is needed in addition to the decrease of the throughput, thereby increasing the cost.

Therefore, in the etching apparatus 1 of the embodiment, the temperature of the wafer W is quickly raised in the chamber 10 during the static eliminating process.

FIG. 6A illustrates a comparative example of the static eliminating process. FIG. 6B illustrates an example of a static eliminating process performed in the etching apparatus 1 according to an embodiment.

In FIGS. 6A and 6B, when the etching process (expressed as "Process" in FIGS. 6A and 6B) ends, the static eliminating process ("T1" and "T2" in FIGS. 6A and 6B) is performed.

In the static eliminating process of FIG. 6A, the supply of the first high frequency power HF and the second high frequency power LF is stopped after finishing the etching process. Next, in the static eliminating process in FIG. 6A, weak plasma is generated by supplying the first high frequency power HF (e.g., frequency is 13.56 MHz) having a relatively low power of about 300 W at time T2 after the elapse of time T1, and the weak plasma is caused to act on the wafer W. This causes the charge on the surface of the wafer W to discharge toward the plasma.

After that, the direct current voltage source 112 applies a minus DC voltage HV (−3000 V) having the opposite sign to the applied plus DC voltage while attracting the wafer W on the chuck electrode 106a to the chuck electrode 106a and eliminates the static charge from the wafer W, thereby removing the wafer W from the electrostatic chuck 106. After the elapse of the static eliminating process time T2, the application of the first high frequency power HF and the second high frequency power HV is stopped, and the static eliminating process finishes.

In the static eliminating process of the embodiment shown in FIG. 6B, the supply of the first high frequency power HF and the second high frequency power LF is stopped when finishing the etching process. Next, in the static eliminating process in FIG. 6B, week plasma is generated by supplying the first high frequency power HF having relatively lower power of about 300 W to the pedestal 20 at time T2 after the elapse of time T1, and the weak plasma is caused to act on the wafer W so as to discharge the charge on the surface of the wafer W toward the plasma. The process up to here is the same as the static eliminating process of FIG. 6A.

After that, in the static eliminating process of FIG. 6B, the second high frequency power LF of 500 W is supplied to the pedestal 20. This allows the temperature of the wafer W to be raised while removing the wafer W from the electrostatic chuck 106. In other words, in the embodiment, the second high frequency power LF is supplied to the pedestal 20 in addition to the first high frequency power HF when removing the wafer W from the electrostatic chuck 106, thereby increasing an amount of incident ions and the temperature of the wafer W rapidly.

Furthermore, as illustrated in FIG. 6B, when supplying the second high frequency power HF, the ion energy is increased by increasing not only the amount of incident ions but also the first frequency power from 300 W to 500 W. In other words, in the embodiment, considering an increase of damage to the wafer W due to the supply of the second high frequency power LF, the first high frequency power HF is increased when supplying the second high frequency power LF to the pedestal 20. This causes the ion energy to increase so as not to increase the amount of incident ions on the wafer W more than necessary, which makes it possible to minimize the damage to the wafer W. Here, the first high frequency power HF may remain 300 W when supplying the second high frequency power LF.

According to this method, rapidly increasing the temperature of the wafer W is possible while maintaining the throughput without installing a special new component or a new function in the etching apparatus 1. In addition to this, blowing dried air to a gap inside the chamber 10 (portion exposed to the atmosphere) is preferable in order to prevent the condensation of the wafer W during the transfer.

[Material of Electrostatic Chuck]

Figure 7:
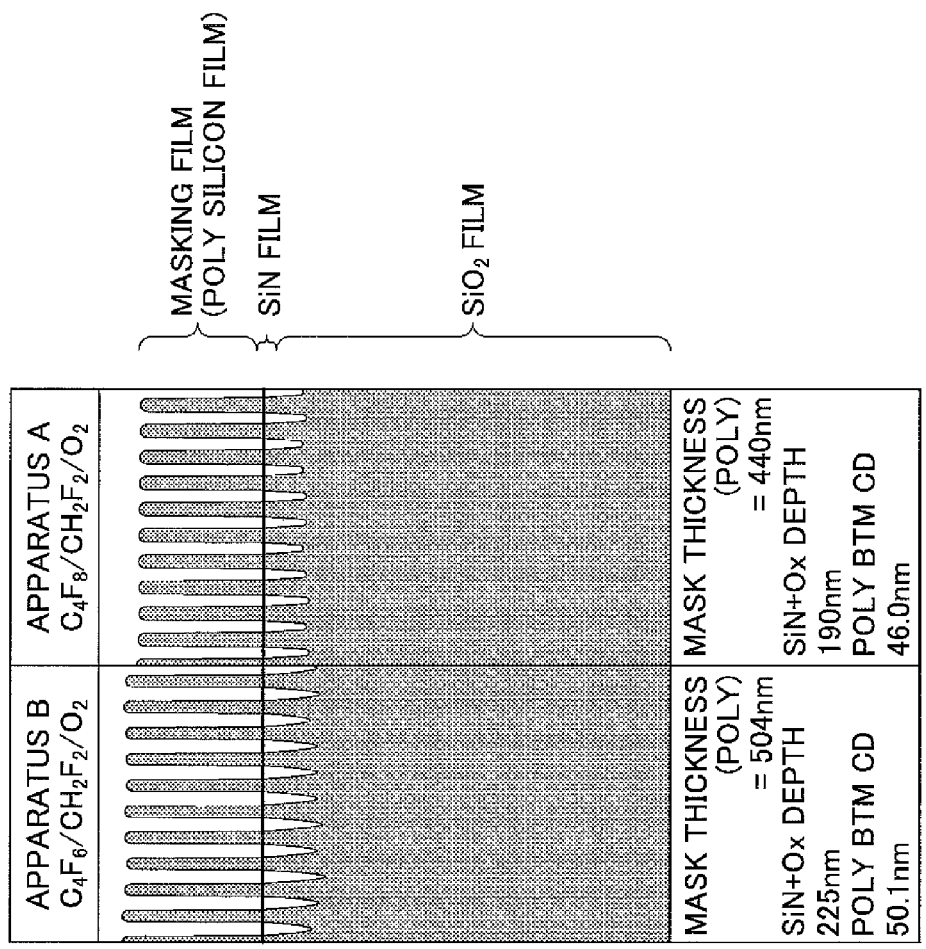
FIG. 7 is a diagram showing a result of an example of an etching process performed at a high temperature.
Figure 8:
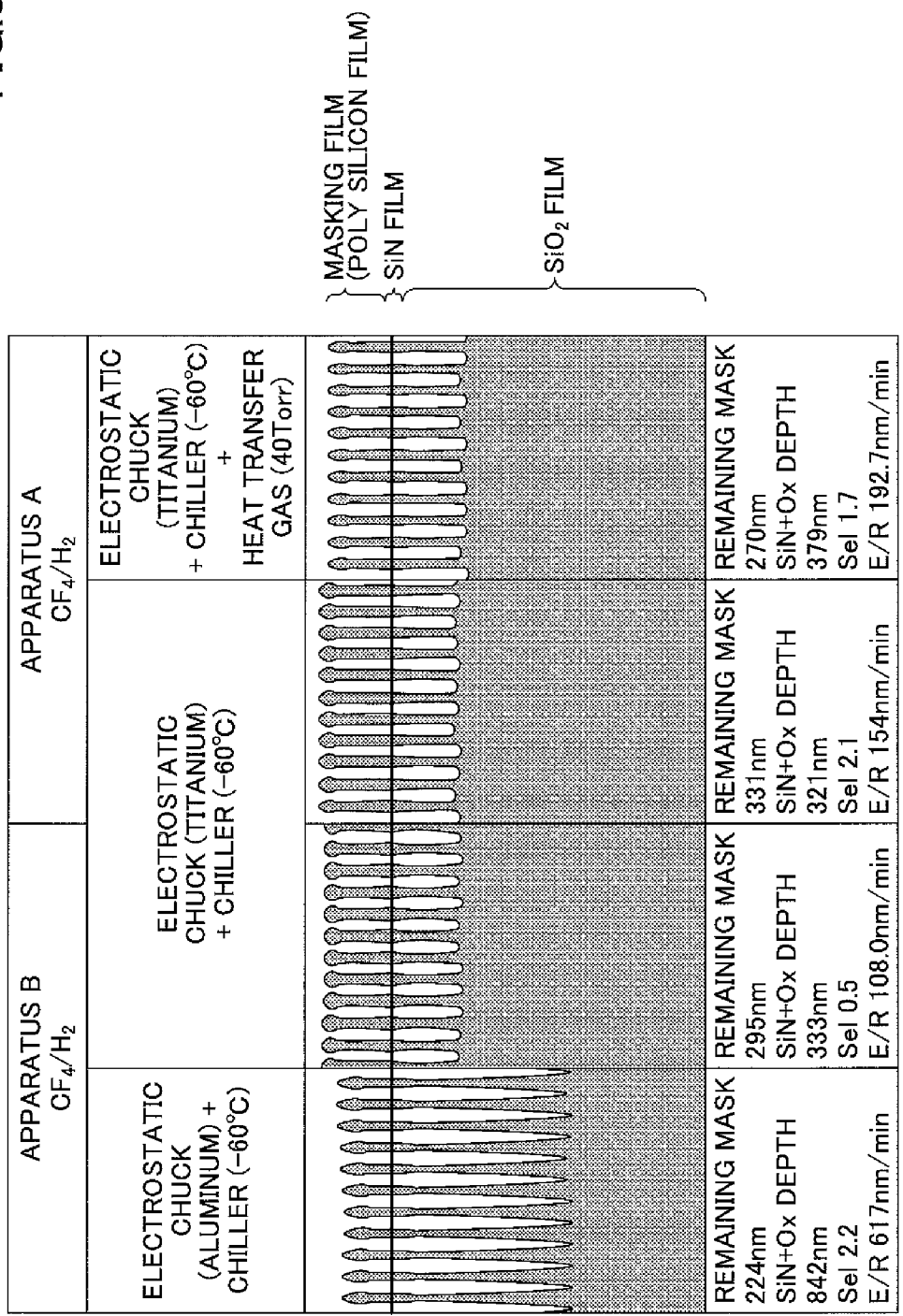
FIG. 8 is a diagram showing a result of an example of an etching process at an extremely low temperature according to an embodiment of the present invention.

Next, a description is given below of the electrostatic chuck 106 used in the etching apparatus 1 according to an embodiment with reference to FIGS. 7 through 10. FIGS. 7 and 8 show results of examples of etching processes performed by using an apparatus A (which has the same configuration as the etching apparatus of FIG. 1) and an apparatus B (which is configured to include a magnet outside the chamber 10 of the etching apparatus 1 of FIG. 1, thereby controlling plasma). In FIGS. 7 and 8, a film to be etched is a stacked multilayer film of a masking film (poly silicon film), a silicon nitride film (SiN), and a silicon oxide film ($SiO_2$). Holes with a high aspect ratio are formed in the silicon nitride film and the silicon oxide film by the etching process of the embodiment.

In the apparatus A and the apparatus B of FIG. 7, the electrostatic chucks 106 are made of aluminum. FIG. 7 shows a result of an example of an etching process of a high temperature process according to a comparative example, and for example, process conditions of the apparatus A and the apparatus B are shown in the following.

Process Conditions of Etching Process:
<Apparatus A>
Gas Type: $C_4F_8/CH_2F_2/O_2$
Temperature of Chiller: 60 degrees C.
Pressure: 15 mTorr (2.0 Pa)
<Apparatus B>
Gas Type: $C_4F_6/CH_2F_2/O_2$
Temperature of Chiller: 60 degrees C.
Pressure: 15 mTorr (2.0 Pa)

In the apparatus A and the apparatus B used in the process of FIG. 8, the electrostatic chucks 106 are made of aluminum or titanium. FIG. 8 shows a result of an example of an etching process of the extremely low temperature process according to the embodiment. For example, process conditions of the apparatus A and the apparatus B are shown in the following.

Process Conditions of Etching Process
<Apparatus A>
Gas Type: $CF_4/H_2$
Temperature of Chiller: −60 degrees C.
Pressure: 60 mTorr (8.0 Pa)

Here, the etching result of the apparatus A on the right side was the case where the electrostatic chuck 106 was made of titanium, and the heat transfer gas of helium (He) at a pressure of 40 Torr (5352 Pa) was supplied. The etching result of the apparatus A on the left side was the case where the electrostatic chuck 106 was made of titanium and the heat transfer gas is not supplied.
<Apparatus B>
Gas Type: $CF_4/H_2$
Temperature of Chiller: −60 degrees C.
Pressure: 60 mTorr (8.0 Pa)

Here, the etching result of the apparatus B on the right side was the case where the electrostatic chuck 106 was made of titanium, and the etching result of the apparatus B on the left side was the case where the electrostatic chuck 106 was made of titanium. In both of the cases, the heat transfer gas is not supplied.

As a result, in the etching process of the extremely low temperature process according to the embodiment, it is noted that the depths of the etching of the silicon nitride film and the silicon oxide film ("SiN+Ox Depth" in FIGS. 7 and 8) are deeper than the depths of the etching in the etching process of the high temperature process shown in FIG. 7. Thus, in the etching process of the extremely low temperature process according to the embodiment, preventing the depth loading and etching the film with the high aspect ratio are possible compared to the etching process of the high temperature process shown in FIG. 7.

Figure 9:
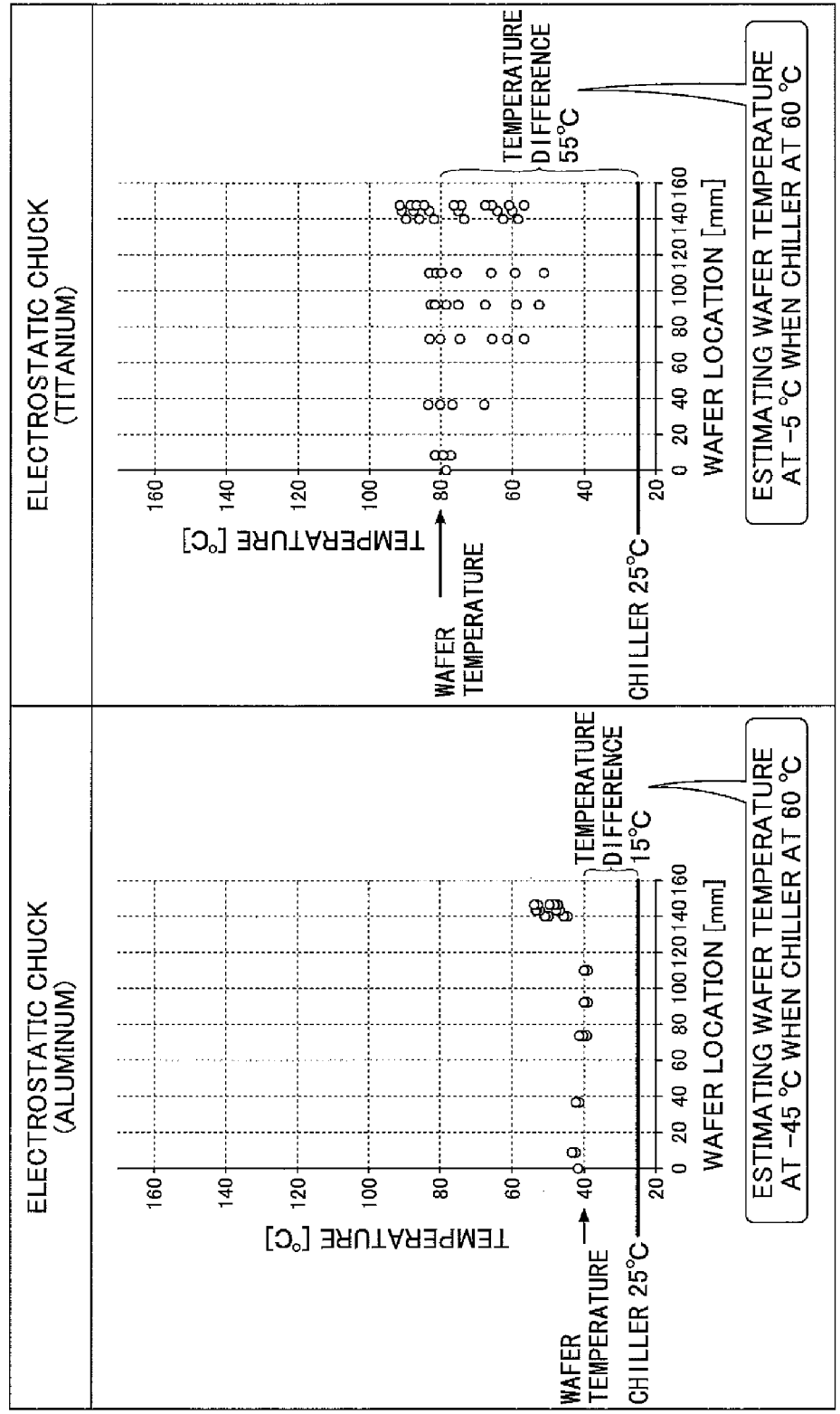
FIG. 9 is a graph showing an example of a relationship between materials of an electrostatic chuck and a temperature of a wafer according to an embodiment.

Moreover, as shown in FIG. 8, the etching rate is higher when using the electrostatic chuck made of aluminum than when using the electrostatic chuck made of titanium. In order to further analyze this result, temperatures of the wafer W were measured when performing the etching process of the extremely low temperature process of the embodiment by using both of the electrostatic chuck 106 made of titanium and aluminum. FIG. 9 shows the result. Process conditions of the etching process at that time were shown as follows:
Gas Type: $CF_4/H_2$
Temperature of Chiller: 25 degrees C.
Pressure: 60 mTorr (8.0 Pa)

FIG. 9 shows the result of the temperature of the wafer W during the etching process measured at a plurality of points. In the case of the electrostatic chuck made of aluminum of FIG. 9, the temperatures of the wafer W during the etching process were approximately 40 degrees C. Because the temperature of the chiller 107 was 25 degrees C., the temperatures of the wafer W were about 15 degrees higher than the temperature of the chiller 107. From this result, when the temperature of the chiller 107 is −60 degrees C., the temperature of the wafer W is estimated to become about −45 degrees C.

Similarly, in the case of the electrostatic chuck 106 made of titanium of FIG. 9, the temperatures of the wafer W during the etching process were approximately 80 degrees C. Because the temperature of the chiller 107 was 25 degrees C., the temperatures of the wafer W were about 55 degrees higher than the temperature of the chiller 107. From this result, when the temperature of the chiller 107 is −60 degrees C., the temperature of the wafer W is estimated to become about −5 degrees C.

From the results, in the case of the electrostatic chuck 106 made of aluminum shown in FIG. 8, the etching rate was higher than that of the electrostatic chuck made of titanium because the temperature of the wafer W when the electrostatic chuck 106 was made of aluminum could be controlled so as to become about −45 degrees C. In other words, when the electrostatic chuck 106 is made of aluminum, the extremely low temperature process of the embodiment is performed as long as the temperature of the chiller 107 is −60 degrees C., which makes it possible to reduce the depth loading and to increase the etching rate.

In contrast, when the electrostatic chuck 106 was made of titanium, because the temperature of the wafer W became about −15 degrees C. even when the temperature of the chiller 107 was about −60 degrees C., the extremely low temperature process of the embodiment could not be performed, and the etching rate was not high. Thus, when performing the etching process of the embodiment by using the electrostatic chuck 106 made of titanium, the temperature of the chiller 107 is preferably controlled so as to become about −100 degrees C. In this case, because a limit value of the cooling medium (brine) of the chiller 107 is about −80 degrees C., liquid nitrogen is preferably used as the cooling medium in order to perform the etching process of the embodiment by using the electrostatic chuck 106 made of titanium. When performing the etching process of the embodiment at an extremely low temperature of about −100 degrees C., titanium is preferably used in the electrostatic chuck 106.

[Pressure Dependency of Heat Transfer Gas]

Furthermore, in FIG. 8, when titanium was used in the electrostatic chuck 106 and the heat transfer gas was supplied, the etching rate was higher than when the heat transfer gas was not supplied. This is because an effect of transferring the heat of the wafer W to the electrostatic chuck 106 increased due to an action of the heat transfer gas and the temperature of the wafer W decreased.

Figure 10:
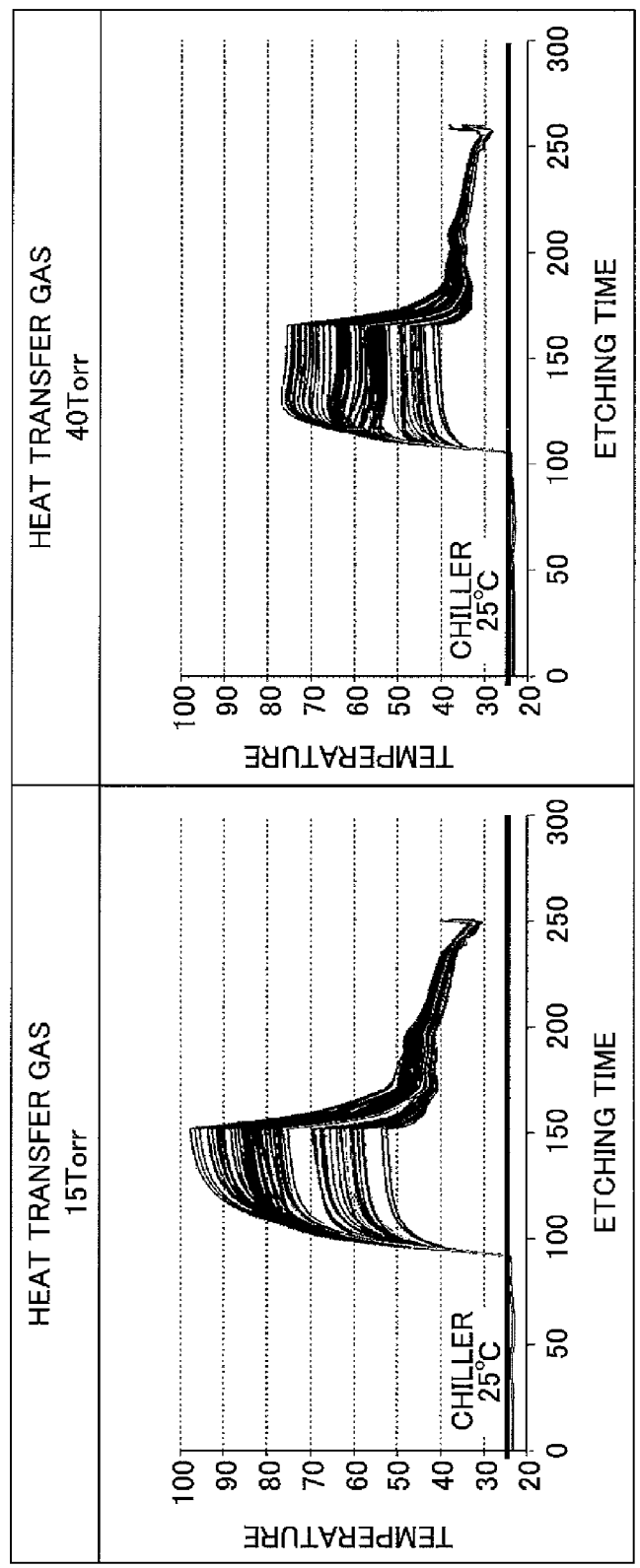
FIG. 10 is a graph showing an example of a relationship between a pressure of a heat transfer gas and a temperature of a wafer according to an embodiment.

Finally, in the etching process of the silicon oxide film at the extremely low temperature of the embodiment, an experiment for analyzing pressure dependency of the heat transfer gas supplied to the back surface of the wafer W was performed. The temperature of the chiller 107 was set at 25 degrees C. The result was shown in FIG. 10. The left-side graph in FIG. 10 shows temperatures of the wafer W when the electrostatic chuck 106 made of titanium is used and a heat transfer gas (He) is supplied at a pressure of 2000 Pa (15 Torr). Each line shows a temperature change at each of a plurality of locations over the etching time.

This result indicates that uniformity of the temperature of the wafer W across the surface can be improved when supplying the heat transfer gas at the pressure of 2000 Pa (15 Torr) and at a pressure of 5332 Pa (40 Torr). Moreover, the result indicates that the wafer W temperature is lower and the uniformity of the wafer W temperature is better when supplying the heat transfer gas at the pressure of 5332 Pa (40 Torr) than when supplying the heat transfer gas at the pressure of 2000 Pa (15 Torr).

Hence, in the etching process of the extremely low temperature according to the embodiment, when using the electrostatic chuck made of titanium, the pressure of the heat transfer gas supplied to the back surface of the wafer while etching the silicon oxide film is preferably controlled so as to become 2000 Pa (15 Torr).

Thus, according to the etching method and the etching apparatus of the embodiments, the depth loading can be suppressed, and the etching rate of the silicon oxide film can be increased.

Hereinabove, although the etching method and the etching apparatus have been described according to the embodiments, the etching method and the etching apparatus of the present invention is not limited to the embodiments and various modifications and improvements can be made without departing from the scope of the invention. Moreover, the embodiments and modifications can be combined as long as they are not contradictory to each other.

For example, the etching process and the static eliminating process of the present invention may be applied not only to a capacitively coupled plasma (CCP: Capacitively Coupled Plasma) apparatus but also to other types of etching apparatuses. For example, the other types of etching apparatus includes an inductively coupled plasma (ICP: Inductively Coupled Plasma) apparatus, a CVD (Chemical Vapor Deposition) apparatus using radial line slot antenna, a helicon wave excited plasma (HWP: Helicon Wave Plasma) apparatus, an electron cyclotron resonance plasma (ECR: Electron Cyclotron Resonance Plasma) apparatus and the like as examples.

A substrate to be processed in the semiconductor fabrication apparatus of the present invention is not limited to the wafer, but for example, may be a large substrate for a flat panel display, a substrate for an EL (electroluminescence) device or a solar cell.

What is claimed is:

1. An etching method, comprising:
    controlling a temperature of a chiller configured to cool a pedestal so as to keep the temperature at −20 degrees C. or lower;
    generating plasma from a hydrogen-containing gas and a fluoride-containing gas supplied from a gas supply source by supplying first high frequency power having a first frequency supplied to the pedestal from a first high frequency power source;
    etching a silicon oxide film deposited on a substrate placed on the pedestal by the generated plasma; and
    supplying second high frequency power having a second frequency lower than the first frequency of the first high frequency power to the pedestal from a second high frequency power source in a static eliminating process after the step of etching the silicon oxide film.

2. The etching method as claimed in claim 1,
    wherein the hydrogen-containing gas is hydrogen ($H_2$) gas, and
    the fluoride-containing gas is carbon tetrafluoride ($CF_4$) gas.

3. The etching method as claimed in claim 1,
    wherein the hydrogen-containing gas is hydrogen ($H_2$) gas, and
    the fluoride-containing gas is nitrogen trifluoride ($NF_3$) gas.

4. The etching method as claimed in claim 1,
    wherein the substrate is held on an electrostatic chuck provided on the pedestal, and
    the electrostatic chuck is made of titanium.

5. The etching method as claimed in claim 1, wherein the step of etching the silicon oxide film deposited on the substrate comprises a step of supplying a heat transfer gas to a back surface of the substrate placed on the pedestal, and
    the heat transfer gas is controlled so as to have a pressure of 2000 Pa (15 Torr) or higher.

6. The etching method as claimed in claim 1, wherein temperature of the chiller is controlled so as to become −60 degrees C. or lower.

7. The etching method as claimed in claim 1, wherein the step of supplying the second high frequency power to the pedestal includes a step of supplying the first high frequency power to the pedestal before supplying the second high frequency power to the pedestal in the static eliminating process.

8. The etching method as claimed in claim 7, wherein the step of supplying the second high frequency power to the pedestal further includes a step of supplying both of the first frequency power and the second frequency power to the pedestal in a superimposed manner, and
    the first frequency power in the step of supplying both of the first frequency power and the second frequency power to the pedestal is higher than the first frequency power in the step of supplying the first high frequency power to the pedestal before supplying the second high frequency power to the pedestal in the static eliminating process.

9. The etching method as claimed in claim 1, wherein a first partial pressure of the fluoride-containing gas is lower than a second partial pressure of the hydrogen-containing gas.

* * * * *